(12) United States Patent
Kim et al.

(10) Patent No.: US 8,644,062 B2
(45) Date of Patent: Feb. 4, 2014

(54) MULTI-LEVEL MEMORY DEVICE USING RESISTANCE MATERIAL

(75) Inventors: Ik-Soo Kim, Yongin-si (KR); Sung-Lae Cho, Gwacheon-si (KR); Do-Hyung Kim, Seongnam-si (KR); Hyeong-Geun An, Hwaseong-si (KR); Dong-Hyun Im, Hwaseong-si (KR); Eun-Hee Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 12/819,498

(22) Filed: Jun. 21, 2010

(65) Prior Publication Data

US 2011/0032752 A1 Feb. 10, 2011

(30) Foreign Application Priority Data

Aug. 10, 2009 (KR) .................. 10-2009-0073351

(51) Int. Cl.
*G11C 11/00* (2006.01)

(52) U.S. Cl.
USPC .............................. 365/163; 365/158; 365/148

(58) Field of Classification Search
USPC ................. 365/148, 158, 161–163, 171, 173, 365/186–188
See application file for complete search history.

(56) References Cited

U.S. PATENT DOCUMENTS

| | | | | |
|---|---|---|---|---|
| 6,625,054 | B2 * | 9/2003 | Lowrey et al. ................ | 365/148 |
| 7,502,251 | B2 * | 3/2009 | Choi et al. .................... | 365/163 |
| 7,638,786 | B2 * | 12/2009 | Matsui et al. ..................... | 257/2 |
| 7,771,896 | B2 * | 8/2010 | Soer et al. ......................... | 430/5 |
| 7,821,810 | B2 * | 10/2010 | Liu ............................... | 365/148 |
| 8,014,189 | B2 * | 9/2011 | Tsukamoto et al. .......... | 365/148 |
| 8,064,247 | B2 * | 11/2011 | Lee et al. ....................... | 365/163 |
| 2006/0228531 | A1 * | 10/2006 | Iwasa et al. ................ | 428/195.1 |
| 2008/0042119 | A1 * | 2/2008 | Sandoval et al. .................. | 257/4 |
| 2009/0035514 | A1 * | 2/2009 | Kang et al. .................... | 428/131 |
| 2010/0171087 | A1 * | 7/2010 | Kurotsuchi et al. ............... | 257/2 |
| 2010/0226164 | A1 * | 9/2010 | Nagashima et al. .......... | 365/148 |
| 2011/0068319 | A1 * | 3/2011 | Tsukamoto et al. ............. | 257/5 |

FOREIGN PATENT DOCUMENTS

JP        2008-310856       * 12/2008
JP        2009099199 A      *  5/2009

OTHER PUBLICATIONS

WO 2008/142768; Kurotsuchi, Kenzo.*

* cited by examiner

*Primary Examiner* — Kretelia Graham
(74) *Attorney, Agent, or Firm* — Myers Bigel Sibley & Sajovec, P.A.

(57) ABSTRACT

A multi-level memory device includes an insulating layer having an opening therein, and a multi-level cell (MLC) formed in the opening that has a resistance level varies based on the data stored therein. The MLC is configured to have a resistance level that varies as write pulses having the same pulse height and different pulse widths are applied to the MLC.

17 Claims, 8 Drawing Sheets

( R1 > R2 > R3 > R4 )

( R1 > R2 > R3 > R4 )

( R1 > R2 > R3 > R4 )

( R1 > R2 > R3 > R4 )

MULTI-LEVEL MEMORY DEVICE USING RESISTANCE MATERIAL

CROSS-REFERENCE TO RELATED APPLICATION

This application claims the benefit of Korean Patent Application No. 10-2009-0073351, filed on Aug. 10, 2009, in the Korean Intellectual Property Office, the disclosure of which is incorporated herein in its entirety by reference.

BACKGROUND

The present invention relates to semiconductor memory devices and, more particularly, to multi-level semiconductor memory devices.

Nonvolatile memories using resistance materials include phase-change random access memories (PRAMs), resistive RAMs (RRAMs), and magnetic RAMs (MRAMs).

While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

Various methods for storing as many bits as possible within a limited area of a semiconductor wafer have been developed. For example, one possible way of storing as many bits as possible within a limited area of a wafer is to develop and use sophisticated lithographic methods and apparatuses in order to increase the number of memory cells that are formed on the wafer. Another way of improving the integration of a memory device is to store more than one bit per unit area in a memory cell. Such a memory device is commonly referred to as a multi-level memory device. For example, in a multi-level memory device that uses a resistance material, each memory cell may include at least three different resistance levels according to data stored. However, in a case of using a multi-level phase change material and a multi-level electrode for the purpose of implementing the resistance levels, the memory device may have a complicated structure, and the feature size of a chip may increase.

SUMMARY

Embodiments of the present invention provide a multi-level memory device for multi-level programming using write pulse widths without increasing the chip size.

Pursuant to some embodiments of the present invention, multi-level memory devices are provided that include an insulating layer that has an opening therein. A multi-level cell (MLC) is formed in the opening of the insulating layer. These devices further include a write circuit that is configured to store one of a plurality of data values in the MLC by applying a respective one of a plurality of write pulses to the MLC, where each of the write pulses has the same pulse height and a different pulse width. The MLC is configured to have a resistance level that varies with the width of the write pulse that is applied so that the write pulses having different widths may be used to store different data values in the MLC.

According to further embodiments of the present invention, multi-level memory devices are provided that include a multi-level cell (MLC) and a write circuit that is configured to store one of a plurality of data values in the MLC by applying a respective one of a plurality of write pulses to the MLC, where each of the write pulses has the same pulse height and a different pulse width. In these devices, the MLC is configured to have a variable resistance level that decreases as the pulse widths of the write pulses increase. As such, write pulses having different pulse widths may be used to store different data values in the MLC.

Pursuant to still further embodiments of the present invention, multi-level memory devices are provided that include a multi-level cell (MLC) that has a resistance level that varies based on the data stored therein, the MLC including only one kind of phase change material (PCM). These devices also include a write circuit that is configured to store one of a plurality of data values in the MLC by applying a respective one of a plurality of write pulses to the MLC, where each of the plurality of write pulses has a different pulse width Tthe MLC is configured so that a ratio of a crystalline area to an amorphous area in the PCM is greater for ones of the plurality of write pulses that have increased pulse widths.

Pursuant to additional embodiments of the present invention, methods of storing data in a multi-level memory device are provided in which a first write pulse having a first width and a first height is applied to a first multi-level cell (MLC) of the multi-level memory device. A second write pulse having a second width and the first height is applied to a second multi-level cell of the multi-level memory device. In these methods, the first write pulse stores data having a first value in the first MLC and the second write pulse stores data having a second value that is different from the first value in the second MLC.

BRIEF DESCRIPTION OF THE DRAWINGS

Examples of embodiments of the present invention will be more clearly understood from the following detailed description taken in conjunction with the accompanying drawings in which.

DETAILED DESCRIPTION

Figure 1:
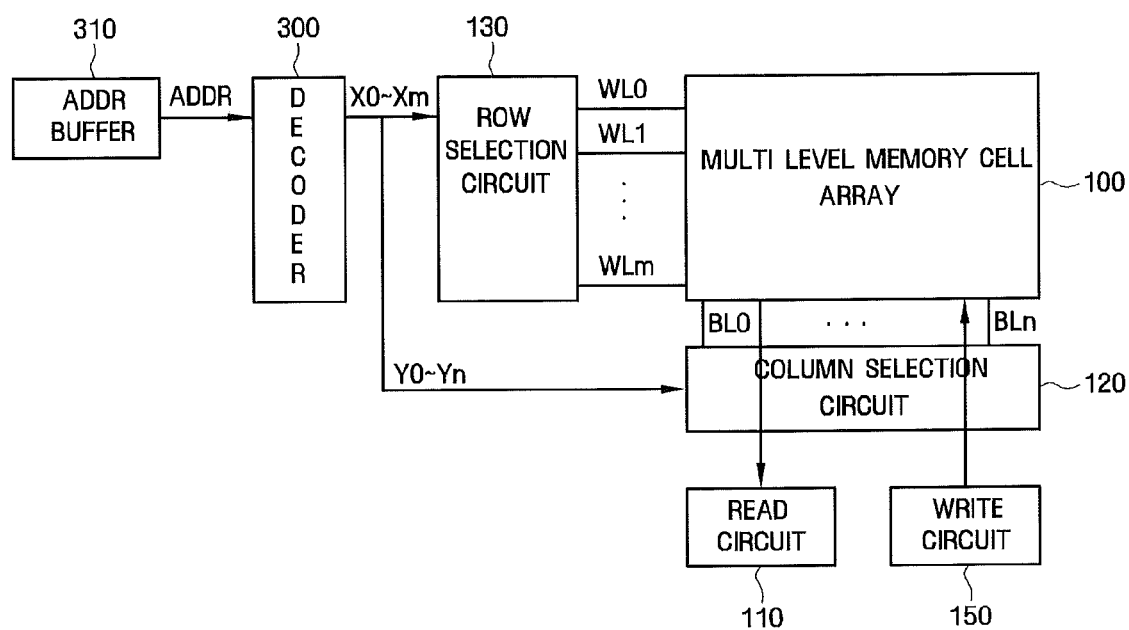
FIG. 1 is a block diagram of a multi-level memory device according to an embodiment of the present invention.

Advantages and features of the present invention and methods of accomplishing the same may be understood more readily by reference to the following detailed description of embodiments thereof and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention will hereinafter be described in detail, using a phase-change random access memory (PRAM) device as an example. However, the present invention is not restricted to PRAM devices. That is, the present invention can also be applied to other nonvolatile memory devices using resistance materials including, for example, a resistive random access memory (RRAM) device, a magnetic random access memory (MRAM) device, and the like.

Figure 2:
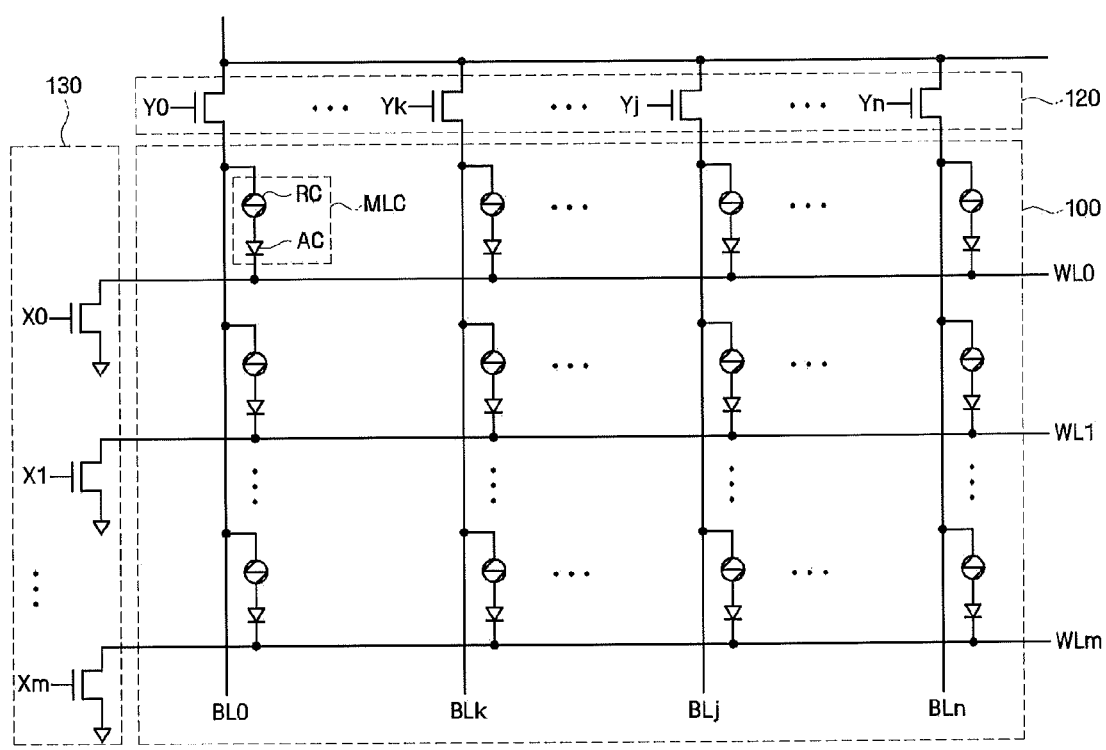
FIG. 2 is a circuit diagram of an embodiment of the multi-level memory cell array shown in FIG. 1.

FIG. 1 is a block diagram of a multi-level memory device according to an embodiment of the present invention. FIG. 2 is a circuit diagram illustrating an embodiment of the multi-level memory cell array shown in FIG. 1.

Referring to FIGS. 1 and 2, the multi-level memory device includes a multi-level memory cell array 100, an address buffer 310, a decoder 300, a row selection circuit 130, a column selection circuit 120, a read circuit 110, and a write circuit 150.

The multi-level memory cell array 100 includes a plurality of multi-level cells (MLCs) which may be arranged in a matrix. Rows of the plurality of MLCs are respectively coupled to a plurality of word lines WL0 through WLm, and columns of the plurality of MLCs are respectively coupled to a plurality of bit lines BL0 through BLn.

As shown in FIG. 2, each MLC includes a variable resistive circuit (RC) and an access circuit (AC). Each of the RCs includes a phase change material having three or more different resistance values according to a crystalline state or an amorphous state. The ACs control currents flowing into the RCs. The ACs may include diodes, transistors, or the like, which may be coupled to the RCs in series. While in the embodiment of FIG. 2 the multi-level memory cell array implements the ACs using diodes, it will be appreciated that the ACs may be implemented in other ways and that the present invention is not limited to diode implementations. In the MLCs, the RCs are implemented in multi-levels and thus store data of 2 or more bits, which will be described in more detail herein.

The decoder 300 transmits row selection signals X0 through Xm to the row selection circuit 130 and column selection signals Y0 through Yn to the column selection circuit 120 in response to an address signal ADDR that is received from the address buffer 310. Thus, the row selection circuit 130 selects word lines (e.g., the word line WL0) from the plurality of the word lines W0 through WLm in response to the row selection signals X0 through Xm. The column selection circuit 30 selects bit lines (e.g., the bit line BL0) from the plurality of bit lines BL0 through BLn in response to the column selection signals Y0 through Yn.

The read circuit 110 reads data from the MLCs which are selected from the multi-level memory cell array 100.

The write circuit 150 writes data to the MLCs which are selected from the multi-level memory cell array 100. For example, the write circuit 150 may include a data input buffer (not shown) which receives and buffers external data and a write driver (not shown) which transmits write pulses to the MLCs that are selected from the multi-level memory cell array 100.

In particular, the write circuit 150 according to the current embodiment applies a plurality of write pulses to the MLCs according to the data stored. The write pulses have the same pulse height and different pulse widths. In more detail, the write circuit 150 applies a first write pulse to a selected MLC to store first data in the selected MLC. The write circuit 150 also applies second and third write pulses to additional selected MLCs to store second and third data in these additional selected MLCs, respectively. The first, second and third write pulses have the same pulse height, but may have different pulse widths. A unit MLC of a multi-level memory device according to an embodiment of the present invention will now be described with reference to FIGS. 3 and 4.

Figure 3:
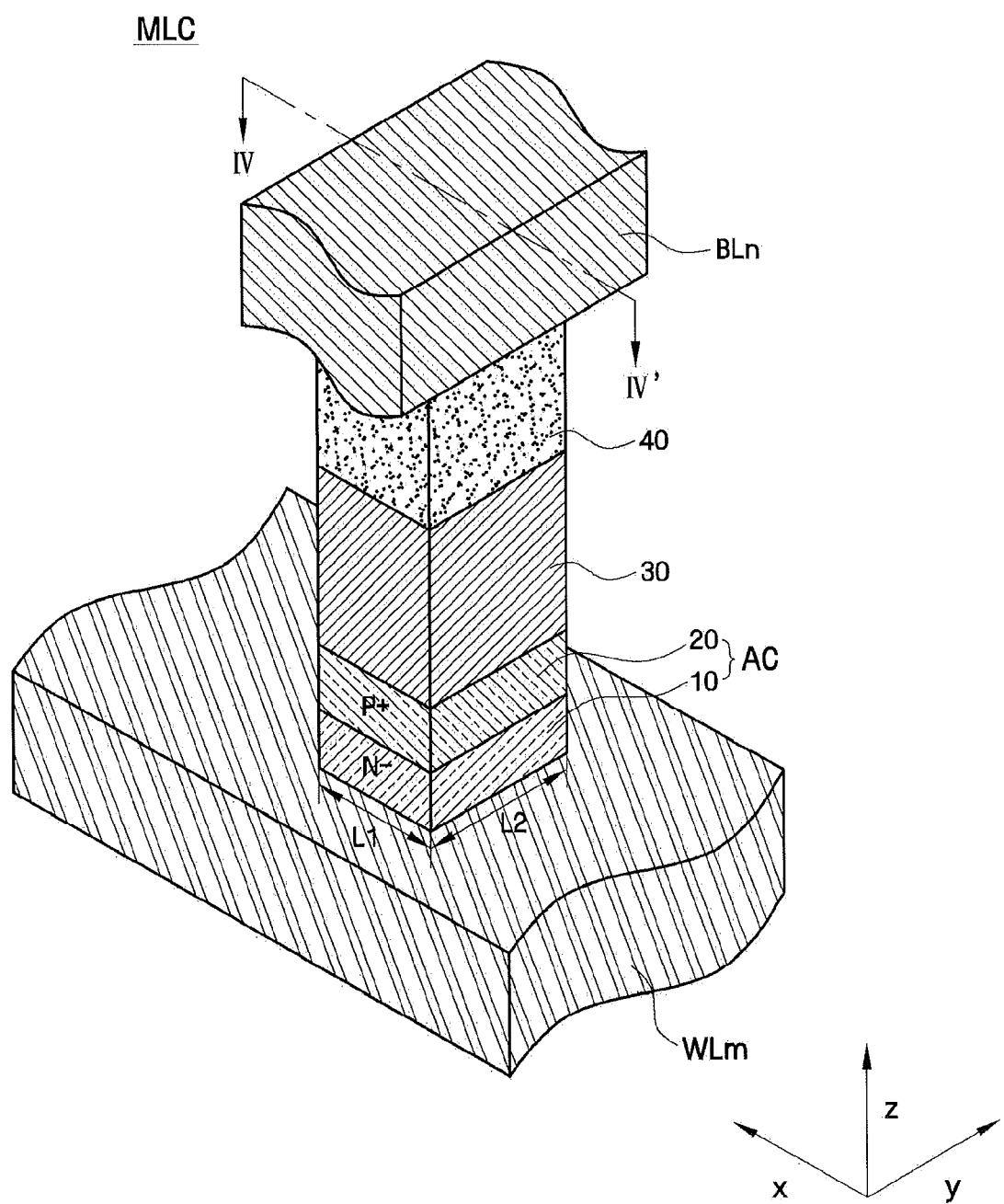
FIG. 3 is a perspective view of an embodiment of one of the multi-level cells (MLC) that are included in the multi-level memory cell array depicted in FIG. 2.
Figure 4:
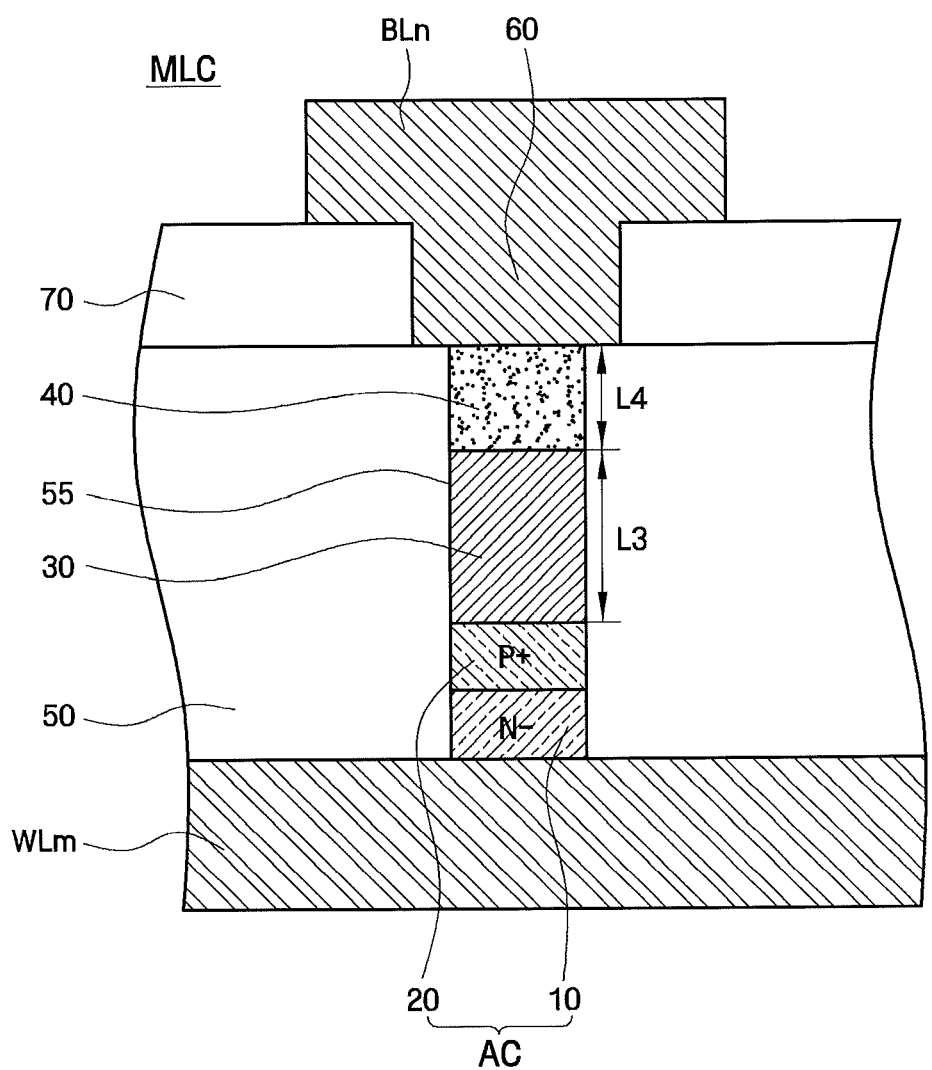
FIG. 4 is a cross-sectional view of the MLC of FIG. 3 taken along the line IV-IV' of FIG. 3.

FIG. 3 is a perspective view of an embodiment of a multi-level cell (MLC) in the multi-level memory cell shown in FIG. 1, and FIG. 4 is a cross-sectional view taken along the line IV-IV' of FIG. 3. For simplicity of illustration and description in FIG. 3, the first and second insulating layers 50 and 70 of FIG. 4 are not illustrated in FIG. 3.

Referring to FIGS. 3 and 4, the MLC includes an AC, a lower electrode 30, a phase change material (PCM) 40, and an upper electrode 60, which comprises a bit line BLn.

As shown best in FIG. 4, the AC may be formed in an opening 55 in the first insulating layer 50. The first insulating layer 50 is formed on a word line WLm extending in a first direction (e.g., the x-axis direction). While the current embodiment illustrates that the AC is formed in the opening 55 of the first insulating layer 50, embodiments of the present invention are not limited thereto. For example, according to further embodiments of the present invention, the AC may be formed outside the opening 55 in the first insulating layer 50.

The AC includes first and second semiconductor patterns 10 and 20. If information is stored in the MLC, the AC controls a write pulse that is applied through a bit line BLn to flow from the upper electrode 60 to the lower electrode 30. Here, the first and second semiconductor patterns 10 and 20 may have different conductivity types. For example, if the first semiconductor pattern 10 is of a first conductivity type (e.g., an N type), the second semiconductor pattern 20 may be of a second conductivity type (e.g., a P type).

The lower electrode 30 may be formed on the AC in the opening 55 in the first insulating layer 50. Thus, both the lower electrode 30 and the AC may be formed in the opening 55 in the first insulating layer 50.

The lower electrode 30 may include, for example, TiN, TiAlN, TaN, WN, MoN, NbN, TiSiN, TiBN, ZrSiN, WSiN, WBN, ZrAlN, MoSiN, MoAlN, TaSiN, TaAlN, TiW, TiAl, TiON, TiAlON, WON, TaON, or the like, or combinations thereof, but embodiments of the present invention are not limited thereto.

The PCM 40 is formed on the lower electrode 30. The PCM 40 may be formed by depositing or forming filling phase change material on the AC and the lower electrode 30, which are formed in the opening 55 of the first insulating layer 50. Thus, the PCM 40, the AC, and the lower electrode 30 may all be formed in the opening 55 in the first insulating layer 50 together.

The PCM 40 and the lower electrode 30 may have substantially the same widths. In particular, as shown best in FIG. 3, the PCM 40 and the lower electrode 30 (which may be formed in the opening 55 of the first insulating layer 50) may have substantially the same width along either or both the x-axis direction and/or along the y-axis direction. In other words, the MLC of the current embodiment may be formed in a confined structure in which the lower electrode 30 and the upper electrode 60 are formed together in the opening 55 of the first insulating layer 50 as described above. Unlike a planar structure which does not include the opening 55, the confined structure may allow a crystalline area to be formed throughout the entirety of the PCM 40, which will be described herein in more detail.

In some embodiments, the PCM 40 may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. GeSbTe, which is a combination of germanium (Ge), antimony (Sb) and tellurium (Te), may be used as the PCM 40 in certain embodiments.

The upper electrode 60 is formed on the PCM 40. The upper electrode 60 may be formed in the second insulating layer. The bit line BLn is formed on second insulating layer 70 and extends in a second direction (e.g., the y-axis direction).

A width of the upper electrode 60 may be greater than each of the widths of the PCM 40 and the lower electrode 30. In more detail, the width (a width on the x axis and/or a width on the y axis) of the upper electrode 60 may be greater than each of the widths of the PCM 40 and the lower electrode 30 which are formed in the opening 55 of the first insulating layer 50.

The upper electrode 60 may be formed of the same material as the material used to form the lower electrode 30, although other materials may also be used. Examples of materials for forming the upper electrode 60 may include titanium (Ti) and/or titanium nitride (TiN).

The AC, the lower electrode 30, and the PCM 40 are all formed in the first insulating layer 50 in FIG. 4, but aspects of the present invention are not limited thereto. For example, according to another embodiment of the present invention, the AC, the lower electrode 30, and at least part of the lower electrode 30 may be respectively formed in different insulating layers.

The embodiment of FIG. 4 shows that the upper electrode 60 is formed in the second insulating layer 70, but aspects of the present invention are not limited thereto. For example, according to another embodiment of the present invention, the first and second insulating layers 50 and 70 may be integrally formed with each other. In other words, the opening 55 may be formed in the first and second insulating layers 50 and 70 that are integrally formed, and the AC, the lower electrode 30, the PCM 40, and the upper electrode 60 may be formed in the opening 55 having the first and second insulating layers 50 and 70 integrally formed therein.

In addition, the embodiment of FIG. 4 shows that the bit line BLn and the upper electrode 60 are integrally formed with each other, but aspects of the present invention are not limited thereto. For example, according to another embodiment of the present invention, the bit line BLn and the upper electrode 60 may be individually formed to be separate from each other.

Figure 5:
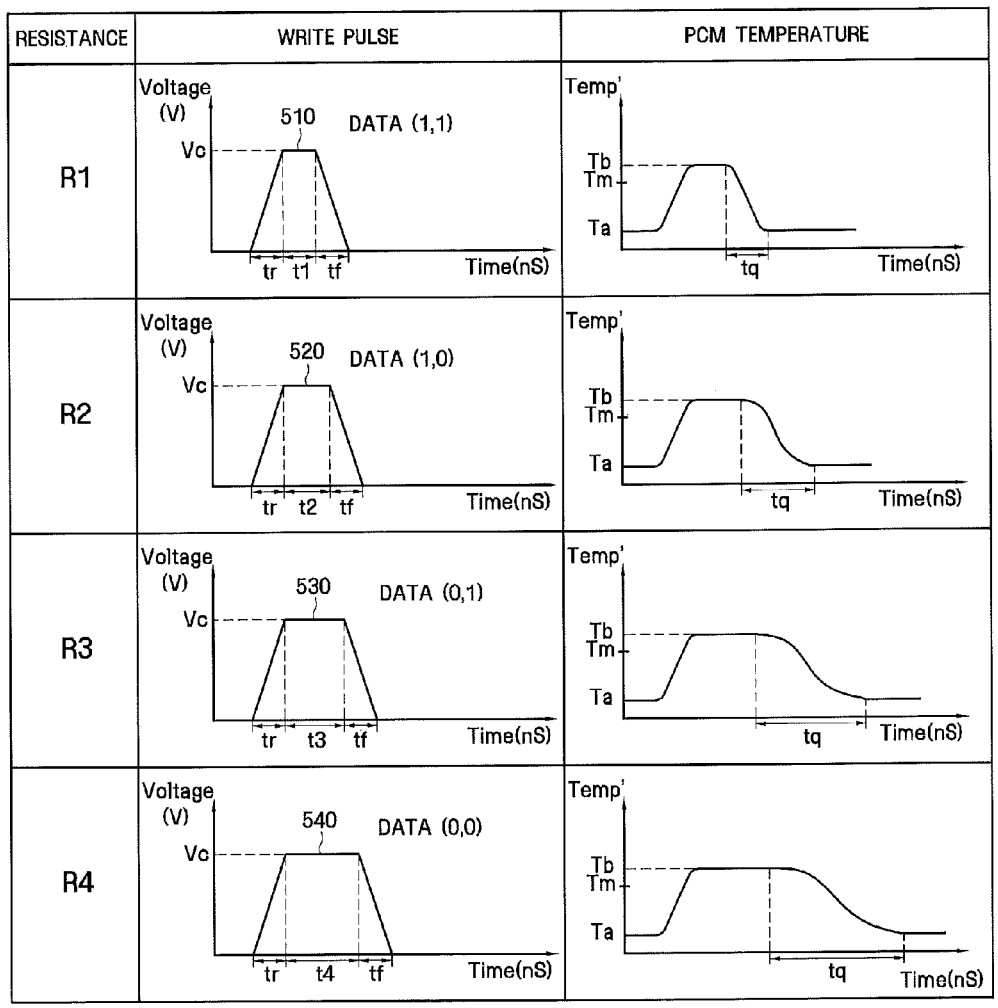
FIG. 5 illustrates how a temperature of a phase change material (PCM) varies when write pulses having different pulse widths are applied to a unit MLC.
Figure 6:
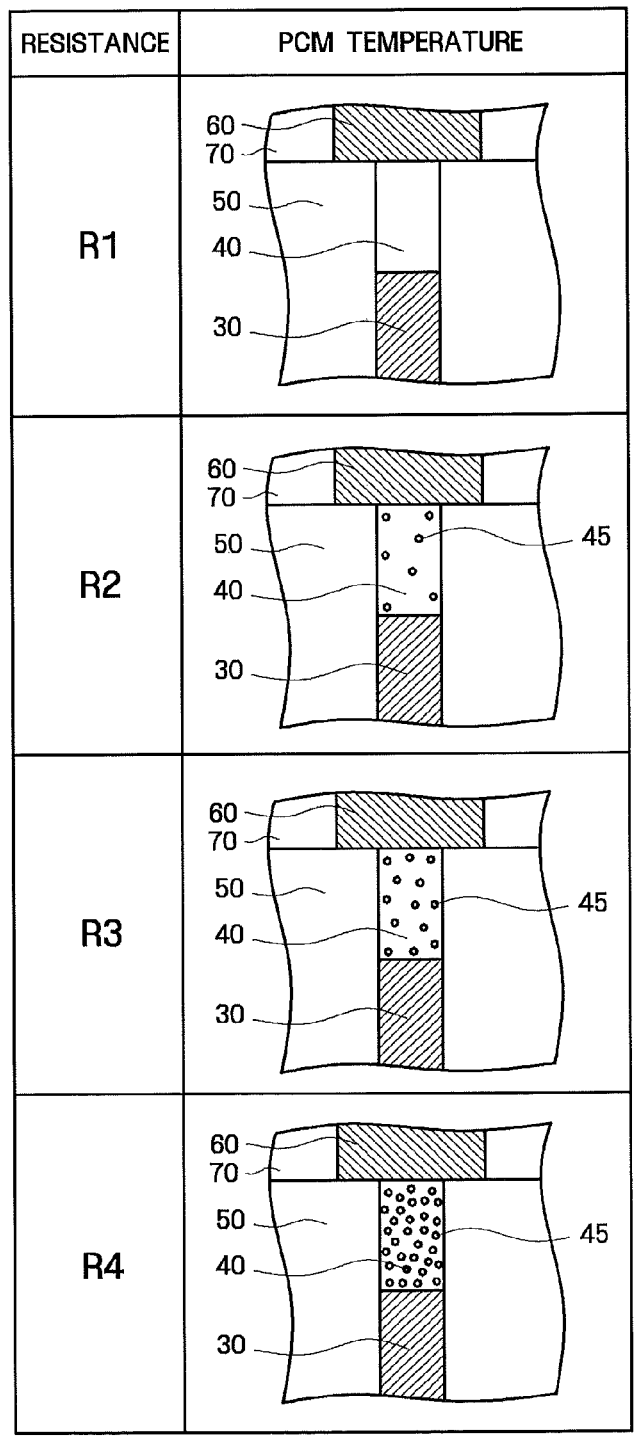
FIGS. 6 and 7 illustrate a change in the crystalline area of a PCM when write pulses having different pulse widths are applied to a unit MLC, respectively.
Figure 7:
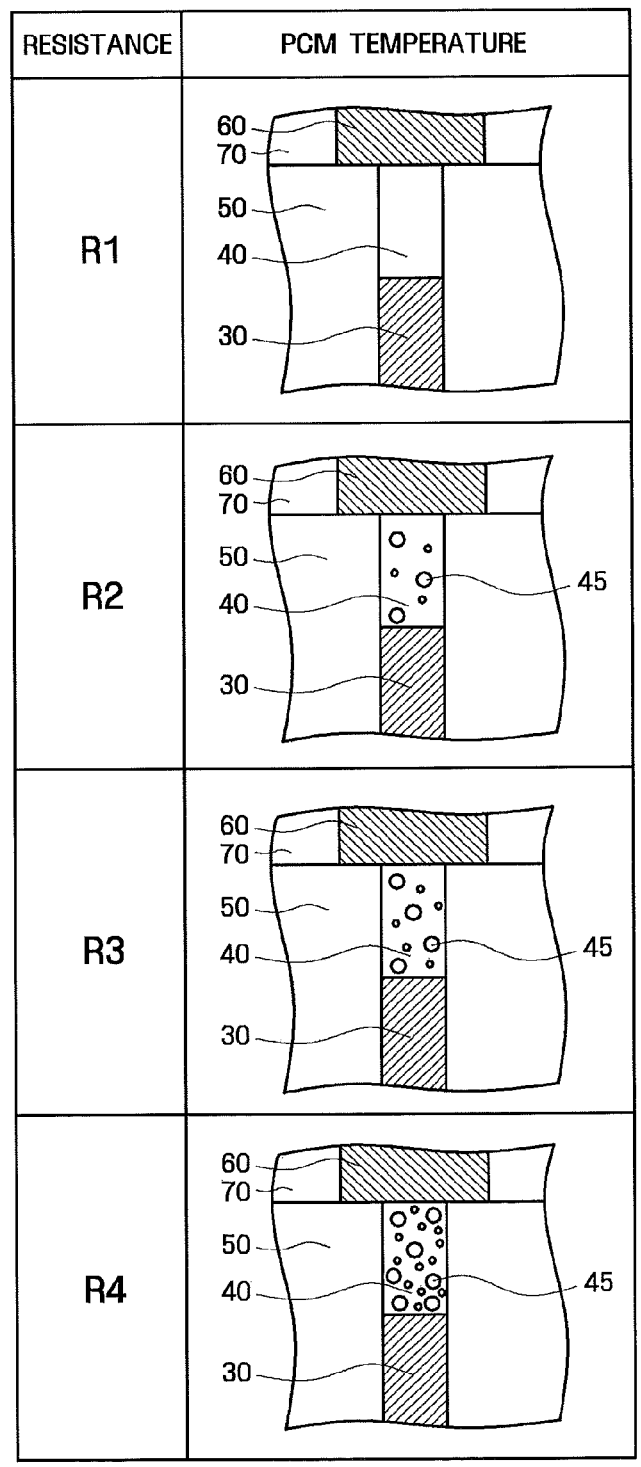

Hereinafter, a multi-level memory device having a unit multi-level cell (MLC) implemented in multi-levels for storing data of at least 2 or more bits according to embodiments of the present invention will be described with reference to FIGS. 5 through 7. FIG. 5 illustrates a change in the temperature of the phase change material (PCM) when write pulses having different pulse widths are applied to a unit MLC. FIGS. 6 and 7 illustrate a change in the crystalline area of a PCM when write pulses having different pulse widths are applied to a unit MLC, respectively.

Referring to FIGS. 5 and 6, the write circuit (150 of FIG. 1) applies a first write pulse 510 to an MLC to store first data, e.g., DATA (1,1), corresponding to a first resistance level R1.

Referring to FIG. 5, a pulse height Vc of the first write pulse 510 may be a predetermined voltage value for distinctly dividing resistance levels of the PCM 40 according to a change in the pulse width, which will later be described in more detail with reference to an Experimental Example. The embodiment of FIG. 5 shows that the pulse height Vc is measured as voltage values, but aspects of the present invention are not limited thereto. For example, according to another embodiment of the present invention, the pulse height Vc may refer to a current value for distinctly dividing resistance levels of the PCM 40 according to the changes in the pulse width.

The first write pulse 510 may include a rising edge period tr, a first write pulse width t1, and a falling edge period tf.

The rising edge period tr refers to a period of time during which the first write pulse 510 having the pulse height Vc is formed. The rising edge period tr may be much shorter than the first write pulse width t1. The first write pulse width t1 refers to a period of time during which the first write pulse 510 having the pulse height Vc is maintained. For example, the first write pulse width t1 may be 10 ns or greater to sufficiently apply heat to the PCM 40. The falling edge period tf refers to a period of time during which the first write pulse 510 having the pulse height Vc disappears. The falling edge period tf may be much shorter than the first write pulse width t1. In some embodiments, the falling edge period tf may be substantially the same as the rising edge period tr.

If the first write pulse 510 is applied to the PCM 40, a temperature of the PCM 40 changes and a crystalline area 45 is formed in the PCM 40. Accordingly, the MLC can be implemented to have the first resistance level R1, which will be described below in more detail.

As shown in FIG. 5, if the first write pulse 510 is applied to the PCM 40, the temperature of the PCM 40 changes from a first temperature Ta to a second temperature. When application of the first write pulse 510 is terminated, the temperature of the PCM 40 is restored to the first temperature Ta through a quenching process. Here, the first temperature Ta may be room temperature, and the second temperature Tb may be a temperature higher than a melting temperature Tm of the PCM 40.

A quenching time tq refers to a time required for the PCM 40 to undergo the quenching process to reach the first temperature Ta from the second temperature Tb. Latent heat may be defined as heat which is supplied the PCM 40 from the write pulses 510, 520, 530 and 540 having a pulse height Vc, in which the PCM 40 is maintained in an amorphous state. The quenching time tq may be extended by increasing the amount of latent heat. In more detail, the greater the pulse widths t1, t2, t3, and t4 of the write pulses 510, 520, 530 and 540, the more latent heat that is supplied to the PCM 40. Accordingly, the quenching time tq required for the latent heat to dissipate out of the PCM 40 may be extended by increasing the pulse width of the write pulse.

A ratio of a crystalline area 45 to an amorphous area in the PCM 40 may vary according to the quenching time tq. In particular, the longer the quenching time tq, the more vigorously local crystallization of the PCM 40 may occur. Accordingly, the ratio of the crystalline area 45 to the amorphous area in the PCM 40 may increase with increasing quenching time tq.

Referring to FIG. 6, if the first write pulse 510 having the first write pulse width t1 is applied to the PCM 40, localization of the PCM 40 does not occur due to a relatively short quenching time tq, suggesting that the PCM 40 may include only the amorphous area. Therefore, the PCM 40 may have the first resistance level R1 corresponding to first data, e.g., DATA (1,1).

Referring to FIGS. 5 and 6, in order to store second data, e.g., DATA (1,0), corresponding to a second resistance level R2, the write circuit (150 of FIG. 1) applies a second write pulse 520 to an MLC. Here, the second resistance level R2 may be a resistance value lower than the first resistance level R1.

A pulse height Vc of the second write pulse 520 is the same as the pulse height Vc of the first write pulse 510, and thus detailed descriptions thereof will not be given.

The second write pulse 520 includes a rising edge period tr, a second write pulse width t2, and a falling edge period tf. The second write pulse width t2 refers to a period of time during which the second write pulse 520 having the pulse height Vc is maintained. The second write pulse width t2 is longer than the first write pulse width t1. The rising edge period tr and the falling edge period tf may be the same as the rising edge period tr and the falling edge period tf of the first write pulse 510, and thus detailed descriptions thereof will be omitted.

If the second write pulse 520 is applied to the PCM 40, a temperature of the PCM 40 changes, and a crystalline area 45 is formed in the PCM 40, thereby implementing the MLC with the second resistance level R2.

As shown in FIG. 5, if the second write pulse 520 is applied to the PCM 40, the temperature of the PCM 40 changes from a first temperature Ta to a second temperature Tb. When application of the second write pulse 520 is terminated, the temperature of the PCM 40 is restored to the first temperature Ta through a quenching process. The first and second temperatures Ta and Tb may be the same as the first and second temperatures Ta and Tb that are described above with regard to the first write pulse 510, and thus detailed descriptions thereof will not be given.

Referring to FIG. 5, the quenching time tq in response to application of the second write pulse 520 may be longer than the quenching time tq in response to application of the first write pulse 510. In particular, since the second write pulse width t2 is longer than the first write pulse width t1, more latent heat is supplied to the PCM 40 in response to the second write pulse 520 than is supplied in response to the first write pulse 510. When the second write pulse 520 is applied to the PCM 40, the quenching time tq, which represents the time required for the latent heat to dissipate out of the PCM 40, may be longer than when the first write pulse 510 is applied thereto. Thus, when the second write pulse 520 is applied to the PCM 40, the extended quenching time tq makes the ratio of the crystalline area 45 to the amorphous area in the PCM 40 larger than when the first write pulse 510 is applied to the PCM 40.

Referring to FIG. 6, when the second write pulse 520 having the second write pulse width t2 is applied to the PCM 40, the quenching time tq is longer than when the first write pulse 510 is applied to the PCM 40. Thus, local crystallization of the PCM 40 may occur. Accordingly, when the second write pulse 520 having the second write pulse width t2 is applied to the PCM 40, a crystalline area 45 may be formed in the PCM 40, making the ratio of the crystalline area 45 to the amorphous area in the PCM 40 larger than when the first write pulse 510 is applied to the PCM 40.

In particular, in a unit MLC of a multi-level memory device according to an embodiment of the present invention, the crystalline area 45 may be formed throughout the PCM 40. In other words, the crystalline area 45 may include a plurality of sub-crystalline areas that are distributed throughout the PCM 40 such that the sub-crystalline areas may be distributed throughout the entire area of the PCM 40, rather than being locally formed specifically around the lower electrode 30 or the upper electrode 60. The plurality of sub-crystalline areas may have substantially the same size with one another.

The thus-formed crystalline area 45 imparts the second resistance level R2 corresponding to the second data, e.g., DATA (1,0), to the PCM 40.

Referring back to FIGS. 5 and 6, the write circuit (150 of FIG. 1) may apply a third write pulse 530 to a unit MLC to store third data, e.g., DATA (0,1), corresponding to a third resistance level R3. The third resistance level R3 may be lower than the first or second resistance value R1 or R2.

A third write pulse width t3 refers to a period of time during which the third write pulse 530 having a pulse height Vc is maintained. The third write pulse width t3 may be longer than each of the first and second write pulse widths t1 and t2. Since the other contents of the third write pulse 530 are substantially the same as described above, detailed descriptions thereof will be omitted.

When the third write pulse 530 is applied to the PCM 40, a temperature of the PCM 40 changes, and a ratio of a crystalline area 45 to an amorphous area in the PCM 40 increases, thereby implementing the MLC with the third level R3.

Referring to FIG. 5, a quenching time tq in response to application of the third write pulse 530 may be longer than each of the quenching times tq in response to application of the first and second write pulses 510 and 520. In particular, since the third write pulse width t3 is longer than each of the first and second write pulse widths t1 and t2, the PCM 40 receives more latent heat in response to application of the third write pulse 530 than it does in response to application of the first or second write pulses 510 and 520. Thus, when the third write pulse 530 is applied to the PCM 40, the quenching time tq that is required for the latent heat to dissipate out of the PCM 40 is longer than when the first and second write pulses 510 and 520 are applied to the PCM 40. When the third write pulse 530 is applied to the PCM 40, the extended quenching time tq makes the ratio of the crystalline area 45 to the amorphous area in the PCM 40 larger than when the first and second write pulses 510 and 520 are applied thereto.

Referring to FIG. 6, when the third write pulse 530 having the third write pulse width t3 is applied to the PCM 40, the quenching time tq is longer than when the first and second write pulses 510 and 520 are applied to the PCM 40, making the ratio of the crystalline area 45 to the amorphous area in the PCM 40 larger than when the first and second write pulses 510 and 520 are applied to the PCM 40. Since the other contents of the crystalline area 45 are substantially the same as described above, detailed descriptions thereof will be omitted.

The thus-formed crystalline area 45 imparts the third resistance level R3 corresponding to the third data, e.g., DATA (0,1), to the PCM 40.

Referring again to FIGS. 5 and 6, the write circuit (150 of FIG. 1) may apply a fourth write pulse 540 to an MLC to store fourth data, e.g., DATA (0,0), corresponding to a fourth resistance level R4. The fourth resistance level R4 may be lower than each of the first, second and third resistance levels R1, R2, and R3.

A fourth write pulse width t4 refers to a period of time during which the fourth write pulse 540 having a pulse height Vc is maintained. The fourth write pulse width t4 may be longer than each of the first, second and third write pulse widths t1, t2, and t3. Since the other contents of the fourth write pulse 540 are substantially the same as described above, detailed descriptions thereof will be omitted.

When the fourth write pulse 540 is applied to the PCM, a temperature of the PCM 40 changes, and a ratio of a crystalline area 45 to an amorphous area in the PCM 40 increases, thereby implementing the MLC with the fourth resistance level R4.

Referring back to FIG. 5, a quenching time tq in response to application of the fourth write pulse 540 is longer than each of the quenching times tq in response to application of the first, second and third write pulses 510, 520 and 530. In particular, the fourth write pulse width t4 is longer than each of the first, second and third write pulse widths t1, t2, and t3. Thus, the PCM 40 receives more latent heat when the fourth write pulse 540 is applied thereto than it does when the first, second and third write pulses 510, 520 and 530 are applied thereto. When the fourth write pulse 540 is applied to the PCM 40, the quenching time tq, which represents the time required for the latent heat to dissipate out of the PCM 40, may be longer than when the first, second and third write pulses 510, 520 and 530 are applied to the PCM 40. When the fourth write pulse 540 is applied to the PCM 40, the extended quenching time tq makes the ratio of the crystalline area 45 to the amorphous area in the PCM 40 larger than when the first, second and third write pulses 510, 520 and 530 are applied to the PCM 40.

Referring to FIG. 6, when the fourth write pulse 540 having the fourth write pulse width t4 is applied to the PCM 40, the quenching time tq is longer than when the first, second and third write pulses 510, 520 and 530 are applied to the PCM 40, making the ratio of the crystalline area 45 to the amorphous area in the PCM 40 larger than when the first, second and third write pulses 510, 520 and 530 are applied to the PCM 40. Since the other contents of the crystalline area 45 are substantially the same as those of the crystalline areas 45, as described above, detailed descriptions thereof will not be given.

The thus-formed crystalline area 45 imparts the fourth resistance level R4 corresponding to the fourth data, e.g., DATA (0,0), to the PCM 40.

In the foregoing examples, the crystalline area 45 is formed throughout the PCM 40, and each sub-crystalline area may have substantially the same size. However, it will be appreciated that the present invention is not limited to such embodiments. For example, as shown in FIG. 7, in alternative embodiments, the crystalline area 45 may be distributed throughout the PCM 40, and may include a plurality of sub-crystalline areas, at least one among which may have a different size from the others.

As described above, according to embodiments of the present invention, the multi-level memory device can be achieved without increasing the chip size by storing data of 2 or more bits using the first, second, third and fourth write pulses 510, 520, 530 and 540 having the same pulse height Vc and different pulse widths. In other words, since no separate PCM or lower electrode for multi-level programming is required, the chip size can be kept small.

In addition, in the multi-level memory device according to embodiments of the present invention, in which write pulses having different pulse heights Vc are applied to one or more PCMs 40, and the sizes of the amorphous areas in each of the PCMs 40 are adjusted using the write pulse widths, it is possible to prevent a drift issue encountered after repeated cycles of write operations, which may change the resistance levels of the PCMs 40, disabling the data stored in the MLC to be read therefrom.

Embodiments of the present invention will now be described in detail with reference to the following Experimental Examples. Technical contents that are not described herein can be readily inferred by one skilled in the art based on the following description, and the detailed description thereof will be omitted.

EXPERIMENTAL EXAMPLES

The sizes of the lower electrode 30 and the PCM 40 of the MLC illustrated in FIGS. 3 and 4 are given below in Table 1. The first, second, third and fourth write pulses 510, 520, 530 and 540 illustrated in FIG. 5 are applied, as shown in Table 2. Resistance values of the PCM 40 are measured while varying the pulse heights Vc of the first, second, third and fourth write pulses 510, 520, 530 and 540.

TABLE 1

| | |
|---|---|
| x Length (L1) | 7.5 nm |
| y Length (L2) | 65 nm |
| Height of Lower Electrode (L3) | 70 nm |
| Height of PCM (L4) | 30 nm |

TABLE 2

| | Rising Edge period (tr) | Pulse Width (t1, t2, t3, t4) | Falling Edge period (tf) |
|---|---|---|---|
| First Write Pulse (510) | 2 ns | 10 ns | 2 ns |
| Second Write Pulse (520) | 2 ns | 30 ns | 2 ns |
| Third Write Pulse (530) | 2 ns | 60 ns | 2 ns |
| Fourth Write Pulse (540) | 2 ns | 100 ns | 2 ns |

Figure 8:
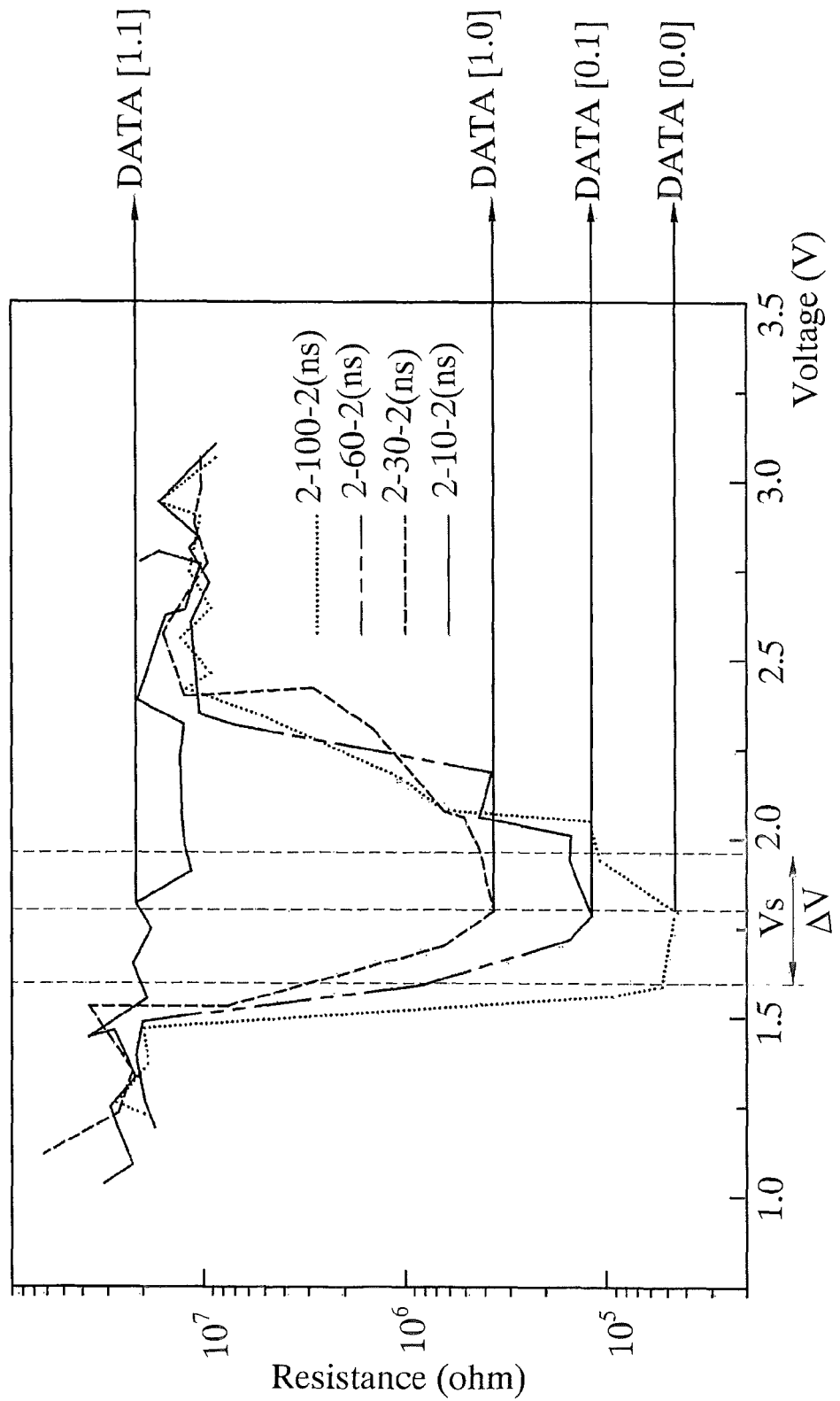
FIG. 8 is a graph illustrating measured results of PCM resistance with varying pulse heights of write pulses according to Experimental Examples of embodiments of the present invention.

The measured resistance values of the PCM 40 are summarized in FIG. 8.

FIG. 8 is a graph illustrating the measured resistance values of the PCMs of the Experimental Examples.

As shown in FIG. 8, when the magnitude of a voltage is within a specific range ΔV, the resistance values of the PCM 40 are distinctly divided according to the first, second, third and fourth write pulses 510, 520, 530 and 540.

When the lower electrode 30 and the PCM of the MLC have the sizes as given in Table 1, the pulse heights Vc of the first, second, third and fourth write pulses 510, 520, 530 and 540 should be voltages within the specific range ΔV. When the pulse heights Vc of the first, second, third and fourth write pulses 510, 520, 530 and 540 are out of the specific range ΔV, the resistance values of the PCM 40 may not be distinctly divided according to the first, second, third and fourth write pulses 510, 520, 530 and 540. It will be appreciated that the specific ranges will vary with other aspects of the design of the PCM and/or MLC that includes the PCM.

More desirably, when the lower electrode 30 and the PCM of the MLC have the sizes as given in Table 1, the pulse heights Vc of the first, second, third and fourth write pulses 510, 520, 530 and 540 may be a specific voltage value Vs. In order to measure the resistance values of the PCM 40, the first, second, third and fourth write pulses 510, 520, 530 and 540 having the pulse heights Vc with the specific value Vs are applied to the PCM 40, and the measured results thereof are summarized in Table 3.

TABLE 3

|  | Resistance Value (Resistance Level) | Data |
| --- | --- | --- |
| First Write Pulse (510) | 1200 kΩ (R1) | (1,1) |
| Second Write Pulse (520) | 400 kΩ (R2) | (1,0) |
| Third Write Pulse (530) | 150 kΩ (R3) | (0,1) |
| Fourth Write Pulse (540) | 40 kΩ (R4) | (0,0) |

As confirmed from FIG. 8 and Table 3, resistance levels R1, R2, R3, and R4 of the PCM 40 or the MLC including the PCM 40 decreased as the pulse widths increase. While the present invention has been particularly shown and described with reference to exemplary embodiments thereof, it will be understood that various changes in form and details may be made therein without departing from the spirit and scope of the following claims.

What is claimed is:

1. A multi-level memory device comprising:
    an insulating layer including an opening;
    a multi-level cell (MLC) formed in the opening; and
    a write circuit that is configured to store one of a plurality of data values in the MLC by applying a respective one of a plurality of write pulses to the MLC, wherein each of the plurality of write pulses has the same pulse height and a different pulse width,
    wherein the MLC is configured to have a resistance level that varies with the width of the write pulse that is applied thereto so that the write pulses having different widths may be used to store different data values in the MLC,
    wherein each of the plurality of write pulses includes a rising edge period, a write pulse width period and a falling edge period, and
    wherein the pulse width is the write pulse width period, which is a period of time during which the write pulse maintains the pulse height,
    wherein each of the plurality of write pulses has the same falling edge period,
    wherein the MLC includes a chalcogenide alloy phase change material which is deposited in the opening,
    wherein a ratio of a crystalline area to an amorphous area in the chalcogenide alloy phase change material increases as the pulse widths of the write pulses increase, and the crystalline area in the chalcogenide alloy phase change material includes a plurality of chalcogenide alloy sub-crystalline areas throughout the entire area of the chalcogenide alloy phase change material.

2. The multi-level memory device of claim 1, wherein the resistance level decreases as the pulse widths of the write pulses increase.

3. The multi-level memory device of claim 1, wherein the insulating layer is on a substrate and the MLC further includes a lower electrode in the opening, wherein the lower electrode and the chalcogenide alloy phase change material are sequentially stacked and have the same cross-sectional width in a first cross-section taken normal to a major surface of the substrate.

4. The multi-level memory device of claim 3, wherein the MLC further includes an upper electrode on the chalcogenide alloy phase change material, wherein a cross-sectional width of the upper electrode along the first cross-section is greater than a cross-sectional width of the lower electrode and a cross-sectional width of the chalcogenide alloy phase change material along the first cross-section.

5. The multi-level memory device of claim 1, wherein the device is configured so a temperature of the chalcogenide alloy phase change material changes from a first temperature to a second temperature during application of one of the write pulses regardless of the width of the write pulse.

6. The multi-level memory device of claim 5, wherein the second temperature is higher than a melting temperature of the chalcogenide alloy phase change material.

7. The multi-level memory device of claim 5, wherein a quenching time during which the temperature of the chalcogenide alloy phase change material changes from the second temperature to the first temperature after one of the write pulses is applied is greater than the width of the write pulse that was applied.

8. The multi-level memory device of claim 7, wherein latent heat in the chalcogenide alloy phase change material increases as the pulse widths of the write pulses applied to the chalcogenide alloy phase change material increase.

9. A multi-level memory device comprising:
    a multi-level cell (MLC); and
    a write circuit that is configured to store one of a plurality of data values in the MLC by applying a respective one of a plurality of voltage pulses to the MLC, wherein each of the plurality of voltage pulses has the same pulse height and a different pulse width,
    wherein the MLC is configured to have a variable resistance level that decreases as the pulse widths of the voltage pulses increase,
    wherein each of the plurality of voltage pulses includes a rising edge period, a voltage pulse width period and a falling edge period, and
    wherein the pulse width is the voltage pulse width period, which is a period of time during which the voltage pulse maintains the pulse height,
    wherein each of the plurality of voltage pulses has the same falling edge period,
    wherein the MLC includes a chalcogenide alloy phase change material,
    wherein a ratio of a crystalline area to an amorphous area in the chalcogenide alloy phase change material increases as the pulse widths of the write pulses increase, and the crystalline area in the chalcogenide alloy phase change material includes a plurality of chalcogenide alloy sub-crystalline areas throughout the entire area of the chalcogenide alloy phase change material.

10. The multi-level memory device of claim 9, wherein the write circuit is configured to apply one of the plurality of voltage pulses to the MLC during a write operation.

11. The multi-level memory device of claim 9, wherein the memory device is configured so that when the write circuit applies a first of the voltage pulses that has a first voltage pulse width to the MLC, the MLC has a first resistance level, when the write circuit applies a second of the voltage pulses that has a second voltage pulse width which is greater than the first voltage pulse width to the MLC, the MLC has a second resistance level that is lower than the first resistance level, and when the write circuit applies a third of the voltage pulses that has a third voltage pulse width which is greater than the second voltage pulse width to the MLC, the MLC has a third resistance level that is lower than the second resistance level.

12. The multi-level memory device of claim 9, wherein a rising edge period and a falling edge period is substantially the same for each of the plurality of voltage pulses.

13. The multi-level memory device of claim 12, wherein the rising edge period is equal to the falling edge period.

14. The multi-level memory device of claim 1, further comprising an access circuit that is disposed in the opening.

15. The multi-level memory device of claim 1, wherein the plurality of chalcogenide alloy sub-crystalline areas are substantially the same in size.

16. The multi-level memory device of claim 9, wherein the plurality of chalcogenide alloy sub-crystalline areas are substantially the same in size.

17. A multi-level memory device comprising:
an insulating layer including an opening on a substrate;
a lower electrode in the opening;
an access circuit in the opening;
a multi-level cell (MLC) that includes a chalcogenide alloy phase change material that is stacked on the lower electrode in the opening and, wherein the lower electrode and the chalcogenide alloy phase change material have the same cross-sectional width in a first cross-section taken normal to a major surface of the substrate;
an upper electrode on the chalcogenide alloy phase change material, wherein a cross-sectional width of the upper electrode along the first cross-section is greater than a cross-sectional width of the lower electrode;
a write circuit that is configured to store one of a plurality of data values in the MLC by applying a respective one of a plurality of write pulses to the MLC, wherein each of the plurality of write pulses has the same pulse height and a different pulse width,
wherein the MLC is configured to have a resistance level that varies with the width of the write pulse that is applied thereto so that the write pulses having different widths may be used to store different data values in the MLC,
wherein each of the plurality of write pulses includes a rising edge period, a write pulse width period and a falling edge period, and
wherein the pulse width is the write pulse width period, which is a period of time during which the write pulse maintains the pulse height,
wherein a ratio of a crystalline area to an amorphous area in the chalcogenide alloy phase change material increases as the pulse widths of the write pulses increase, and the crystalline area in the chalcogenide alloy phase change material includes a plurality of chalcogenide alloy sub-crystalline areas throughout the entire area of the chalcogenide alloy phase change material.

* * * * *